(12) United States Patent
Xiao

(10) Patent No.: US 11,914,290 B2
(45) Date of Patent: Feb. 27, 2024

(54) OVERLAY MEASUREMENT TARGETS DESIGN

(71) Applicant: KLA Corporation, Milpitas, CA (US)

(72) Inventor: Hong Xiao, Pleasanton, CA (US)

(73) Assignee: KLA CORPORATION, Milpitas, CA (US)

( * ) Notice: Subject to any disclaimer, the term of this patent is extended or adjusted under 35 U.S.C. 154(b) by 813 days.

(21) Appl. No.: 16/933,297

(22) Filed: Jul. 20, 2020

(65) Prior Publication Data

US 2021/0026238 A1    Jan. 28, 2021

Related U.S. Application Data

(60) Provisional application No. 62/877,898, filed on Jul. 24, 2019.

(51) Int. Cl.
| | |
|---|---|
| *G03F 1/86* | (2012.01) |
| *H01L 21/027* | (2006.01) |
| *G03F 7/00* | (2006.01) |
| *H10B 12/00* | (2023.01) |

(52) U.S. Cl.
CPC ............ *G03F 1/86* (2013.01); *G03F 7/70625* (2013.01); *G03F 7/70633* (2013.01); *H01L 21/0273* (2013.01); *H10B 12/00* (2023.02)

(58) Field of Classification Search
CPC .... G03F 1/86; G03F 7/70625; G03F 7/70633; G03F 7/70683; H01L 21/0273; H10B 12/00
See application file for complete search history.

(56) References Cited

U.S. PATENT DOCUMENTS

| | | | |
|---|---|---|---|
| 7,042,569 B2 | 5/2006 | Sezginer et al. | |
| 7,061,615 B1 | 6/2006 | Lowe-Webb | |
| 9,563,131 B2 | 2/2017 | Quintanilha | |
| 9,709,903 B2 | 7/2017 | Choi et al. | |
| 9,812,324 B1 | 11/2017 | Zhuang et al. | |
| 9,915,879 B2 | 3/2018 | Quintanilha et al. | |
| 9,977,344 B2 | 5/2018 | Tel et al. | |
| 10,228,320 B1 | 3/2019 | Levinski et al. | |
| 10,386,176 B2 | 8/2019 | Bhattacharyya et al. | |
| 2004/0233441 A1 | 11/2004 | Mieher et al. | |
| 2005/0285283 A1 | 12/2005 | Huggins | |

(Continued)

FOREIGN PATENT DOCUMENTS

| | | |
|---|---|---|
| CN | 1239322 A | 12/1999 |
| CN | 104425613 A | 3/2015 |

(Continued)

OTHER PUBLICATIONS

ISA/KR, International Search Report for PCT/US2020/043161, dated Nov. 4, 2020.

(Continued)

*Primary Examiner* — Stewart A Fraser
(74) *Attorney, Agent, or Firm* — Hodgson Russ LLP

(57) ABSTRACT

A device area includes at least a first layer of photoresist and a second layer of photoresist. First layer metrology targets are positioned at an edge of one of the sides of the first layer of the mat. The first layer metrology targets have a relaxed pitch less than a device pitch. Secondary electron and back-scattered electron images can be simultaneously obtained.

19 Claims, 12 Drawing Sheets

(56) References Cited

U.S. PATENT DOCUMENTS

| | | | |
|---|---|---|---|
| 2008/0029913 A1* | 2/2008 | Taylor | G03F 7/70633 257/797 |
| 2009/0087756 A1 | 4/2009 | Schulz | |
| 2011/0248388 A1 | 10/2011 | Ausschnitt et al. | |
| 2013/0242305 A1 | 9/2013 | Cohen | |
| 2014/0065736 A1 | 3/2014 | Amir et al. | |
| 2014/0141536 A1 | 5/2014 | Levinski et al. | |
| 2015/0061016 A1 | 3/2015 | Chiang et al. | |
| 2016/0282730 A1* | 9/2016 | Sasaki | H01L 22/12 |
| 2018/0046096 A1* | 2/2018 | Shibazaki | G01B 11/00 |
| 2018/0113387 A1* | 4/2018 | Xiao | G03F 7/70683 |
| 2019/0178639 A1 | 6/2019 | Gutman et al. | |
| 2019/0179231 A1 | 6/2019 | Laske et al. | |
| 2019/0278166 A1 | 9/2019 | Sun et al. | |
| 2020/0081357 A1* | 3/2020 | Toshima | G03F 9/7065 |

FOREIGN PATENT DOCUMENTS

| | | |
|---|---|---|
| CN | 107636538 A | 1/2018 |
| CN | 108886006 A | 11/2018 |
| KR | 20150106171 A | 9/2015 |
| KR | 1020150106171 A | 9/2015 |

OTHER PUBLICATIONS

ISA/KR, Written Opinion of the International Searching Authority for PCT/US2020/043161, dated Nov. 4, 2020.

Wiaux et al., Split and Design Guidelines for Double Patterning, Proc. SPIE, Optical Microlithography XXI, 2008, abstract.

Leray et al., Hybrid Overlay Metrology with CDSEM in a BEOL Patterning Scheme, Proc. SPIE, Metrology, Inspection, and Process Control for Microlithography XXIX, 2015, abstract.

Inoue & Hasumi, Review of Scanning Electron Microscope-based Overlay Measurement Beyond 3-nm Node Device, J. of Micro/Nanolithography, MEMS, and MOEMS, 18(2), 021206, 2019.

Leray et al., Hybrid Overlay Metrology for High Order Correction by Using CDSEM, Proc. SPIE, Metrology, Inspection, and Process Control for Microlithography XXIX, 2016, abstract.

CNIPA, First Office Action for CN Application No. 202080052814.3, dated Aug. 17, 2022.

* cited by examiner

OVERLAY MEASUREMENT TARGETS DESIGN

CROSS-REFERENCE TO RELATED APPLICATIONS

This application claims priority to the provisional patent application filed Jul. 24, 2019 and assigned U.S. App. No. 62/877,898, the disclosure of which is hereby incorporated by reference.

FIELD OF THE DISCLOSURE

This disclosure relates to semiconductor metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using many fabrication processes to form various features and multiple levels of the semiconductor devices. For example, photolithography is a semiconductor fabrication process that involves transferring a pattern from a reticle to a photoresist arranged on a semiconductor wafer. Additional examples of semiconductor fabrication processes include, but are not limited to, wafer clean, thermal oxidation, chemical-mechanical polishing (CMP), etch, dielectric and conductive thin-film depositions, selective epitaxial growth, ion implantation, and rapid thermal annealing (RTP). An arrangement of multiple semiconductor devices fabricated on a single semiconductor wafer may be separated into individual semiconductor devices.

The relative position of structures within a semiconductor device is referred to as overlay (OVL). The measurement of overlay error between successive patterned layers on a wafer is a process control technique in integrated circuit manufacturing. Overlay accuracy generally pertains to the determination of how accurately a first patterned layer aligns with respect to a second patterned layer disposed above or below it and to the determination of how accurately a first pattern aligns with respect to a second pattern disposed on the same layer.

Metrology processes are used at various steps during a semiconductor manufacturing process to monitor and control one or more semiconductor layer processes. Overlay error is one of the characteristics that is monitored and controlled. The overlay error is typically determined with an overlay target having structures formed on one or more layers of a workpiece (e.g., a semiconductor wafer). If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of the semiconductor fabrication processes.

Overlay metrology targets are printed to measure registration between two or more layers. The structures on the wafer may take the form of gratings, and these gratings may be periodic. If the two layers or patterns are properly formed, then the structure on one layer or pattern may be aligned relative to the structure on the other layer or pattern.

Overlay measurement can be important in integrated circuit manufacturing processes because it ensures that mask layers align with each other. Overlay measurement is mainly performed using optical instruments on designed measurement targets. A design measurement target is usually on the scribe line between dies on the wafer. As feature size scales deep into the nanometer range, the overlay measured from the test patterns in a scribe line sometimes does not correlate to the overlay of the real device due to the pattern difference and the feature size difference between them. This can cause yield loss in integrated circuit manufacturing.

Scanning electron microscope (SEM) image-based overlay measurement is an option for integrated circuit process control at advanced nanometer nodes. FIG. 1 shows a schematic of SEM system and the SEM image that has both previous layer (Layer 1) and current layer (Layer 2) that can be used for overlay measurement. Electron beam images have been used to measure overlay after etching a device area. After development inspection (ADI) overlay measurements used an optical system in the scribe line on specially-designed overlay targets that do not resemble the real device. Another previous method used a high landing energy (LE) electron beam to measure overlay direction on device at the ADI.

Overlay metrology becomes more important as the feature sizes shrink. Commonly-used optical metrology on optical overlay targets may be unable to correlate to the overlay results in the devices because the feature size of optical targets usually is larger than real devices and the optical targets are usually located in a scribe line of the die far from the real devices. Overlay measurement after pattern etch, commonly called after etch inspection (AEI), on devices with an SEM was tested. The difference between AEI SEM-OVL on device measurement and the optical overlay measurement after photolithography process, commonly called ADI, is called none-zero offset (NZO). More integrated circuit manufacturing facilities of advanced nanometer technology nodes are using NZO to calibrate and control the overlay. As the technology further advances, integrated circuit manufacturers may require SEM overlay measurement at ADI, on devices if possible. However, using an ADI layer, the previous layer is buried underneath one or more films ranging from dozens of nanometers to several hundred nanometers depending on the device and layer. At AEI, the previous layer usually has been exposed by the etch process. The previous layer patterns could be at the bottom of trenches or holes several hundred nanometers from the surface, such as where the current layer patterns are located. To measure the overlay with an SEM, electrons need to have enough energy to reach the buried pattern with a beam spot tight enough to resolve it and still have enough energy to come back out of the sample surface. To resolve the buried pattern, there should be enough contrast between the pattern material and the background material. The electron beam disperses after entering the sample. The deeper of the electron beam goes, the larger the dispersion diameter. Increased landing energy of the primary beam can help to reduce the beam dispersion, but the high-energy electrons penetrate through the buried pattern easily and reduce the contrast of the buried pattern. For some dynamic random-access memory (DRAM) ADI layers, the previous layers are deeply buried and the electron beam disperses too much spatially. Thus, the previous layer patterns cannot be resolved in device area and it can be difficult to measure overlay in a device area.

ADI optical overlay measurement on a target in a scribe line sometimes does not correlate to overlay error in a real device. Integrated circuit manufacturers need to wait for the SEM-based on-device overlay measurement results to make the correction. For electron beam ADI on-device overlay measurement, the photoresist will be damaged by the electron beam and energetic electrons also can damage the integrated circuit device. Damage from the electron beam can kill the device.

Overlay measurements are typically performed after a photoresist etch. A wafer is reworked if photoresist is not aligned, but the photoresist pattern can be affected when it is hit with an electron beam. Thus, optical imaging may be performed to avoid damage to the devices. However, the overlay targets must be larger for optical imaging than those used in electron beam imaging. Space is limited on a semiconductor wafer, and this uses more space.

Improved target designs and methods of measurement are needed as integrated circuit devices become more complex.

BRIEF SUMMARY OF THE DISCLOSURE

A device is provided in a first embodiment. The device includes a mat in a device area having four sides and a plurality of extensions in the first layer that extend beyond the sides of the mat. The mat includes at least a first layer of photoresist and a second layer of photoresist disposed on the first layer. Each of the extensions in the first layer includes a first layer metrology target. The first layer metrology targets have a relaxed pitch less than a device pitch in the second layer of the mat. The second layer can define a pattern of apertures. The second layer covers at least part of each first layer metrology target.

The device area may be part of a DRAM device.

The device can include a plurality of extensions of the second layer. Each of the extensions of the second layer is part of the second layer at an edge of one of the four sides of the mat. The extensions in the second layer can extend beyond the sides of the mat.

The mat may be a smaller than 60 µm in height and width. The extensions of the first layer can be smaller than the mat.

The device can include a third layer disposed on an opposite side of the second layer from the first layer. The third layer can include a plurality of extensions of the third layer. Each of the extensions of the third layer can be at an edge of one of the four sides of the mat. The third layer can define a plurality of apertures.

The relaxed pitch may be four times less than the device pitch. In an instance, the relaxed pitch is eight times less than the device pitch. The relaxed pitch may be larger than 40 nm.

A method is provided in a second embodiment. The method includes providing a device. The device includes a mat in a device area having four sides and a plurality of extensions in the first layer that extend beyond the sides of the mat. The mat includes at least a first layer of photoresist and a second layer of photoresist disposed on the first layer. Each of the extensions in the first layer includes a first layer metrology target. The first layer metrology targets have a relaxed pitch less than a device pitch in the second layer of the mat. The second layer defines a pattern of apertures. The second layer covers at least part of each first layer metrology target.

An image of at least one of the first layer overlay targets is obtained with an electron beam metrology tool. The obtaining includes simultaneously obtaining a secondary electron image of the second layer and obtaining a back-scattered electron image of the first layer with the relaxed pitch. Metrology is performed with the image using a processor. The metrology can be overlay or critical dimension.

The secondary electron image of the second layer can be a non-zero distance from the back-scattered electron image of the first layer. The secondary image of the second layer can be a non-zero distance from a closest of the sides.

The relaxed pitch may be unresolved by the electron beam metrology tool and the device pitch may be resolved by the electron beam metrology tool.

The device area can be part of a DRAM device.

The method can include a device with a plurality of extensions of the second layer. Each of the extensions of the second layer is part of the second layer at an edge of one of the four sides of the mat. The extensions of the second layer extend beyond the sides of the mat.

The device can include a third layer disposed on an opposite side of the second layer from the first layer. The third layer includes a plurality of extensions of the third layer. Each of the extensions of the third layer is part of the third layer at an edge of one of the four sides of the mat. The third layer defines a plurality of apertures. The method further comprises obtaining a secondary electron image of the third layer with the pattern of apertures and obtaining a back-scattered electron image of the first layer, which can be obtained simultaneously.

The mat may be a smaller than 60 µm in height and width. The extensions of the first layer can be smaller than the mat. The relaxed pitch may be larger than 40 nm.

An electron beam metrology tool can be used for the method of second embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein address several problems with overlay metrology. First, optical overlay targets are typically located far from device areas and the optical overlay target designs are different from the real device layout. Distance and differences in design contribute to correlation issue between optical overlay measurement and overlay value in real devices. Embodiments disclosed herein enable imaging the buried previous layer by an SEM-based overlay measurement system in a real device pattern during ADI overlay measurement. The pitch of buried previous patterns is relaxed from the dense real device pattern, which means it can be relatively imaged for the overlay measurement. With a large field of view (FoV) SEM system, all four targets of the layer using the embodiments disclosed herein can be measured without moving the stage. This allows highly effective overlay measurement in both the X-direction and Y-direction.

Embodiments disclosed herein can enable forming electron beam overlay measurement targets using realistic device layout to form the current layer, which is the photoresist pattern at an ADI step, and extends to the buried previous layer at a periphery with relaxed pitch. Thus, an electron beam can resolve the pattern even if the resolution has been compromised when a high-energy electron beam penetrates deep into the sample to reach the previous layer. This can be used with self-aligned quadruple patterning (SAQP) because the multiple patterning assistant layers need to be deposited before the photoresist coating and patterning.

SAQP can apply self-aligned double patterning (SADP) twice in a row to achieve an effective pitch quartering. With SADP, a spacer is formed by deposition or reaction of the film on the previous pattern followed by etching to remove all the film material on the horizontal surfaces. This leaves only the material on the sidewalls. By removing the original patterned feature, only the spacer is left. However, since there are two spacers for every line, the line density has now doubled. As SAQP applies SADP twice, the critical dimension (CD) and the spacing between features are each defined by either a first or second spacer.

Figure 1:
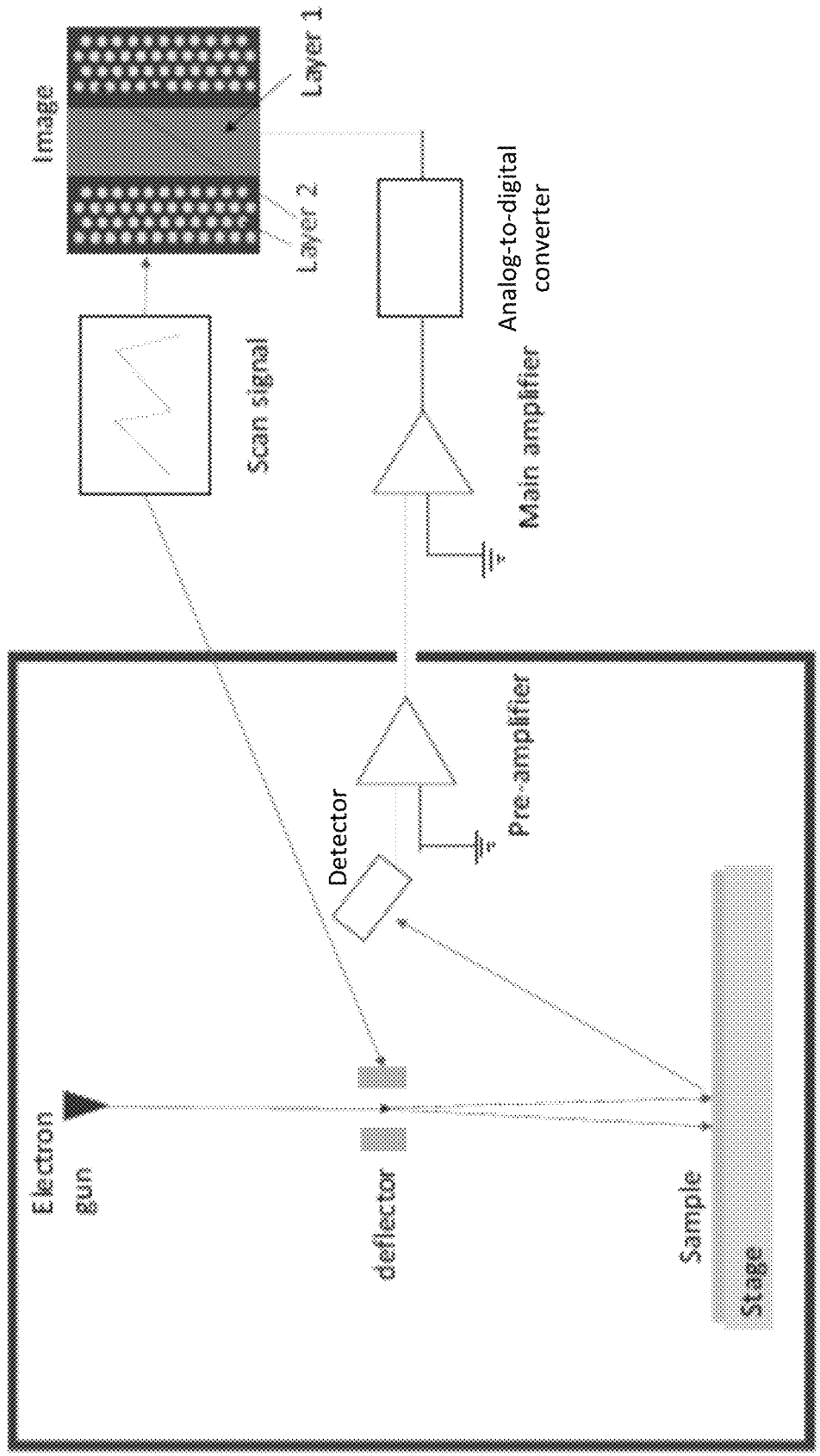
FIG. 1 is a diagram illustrating overlay measurement using an SEM.
Figure 2:
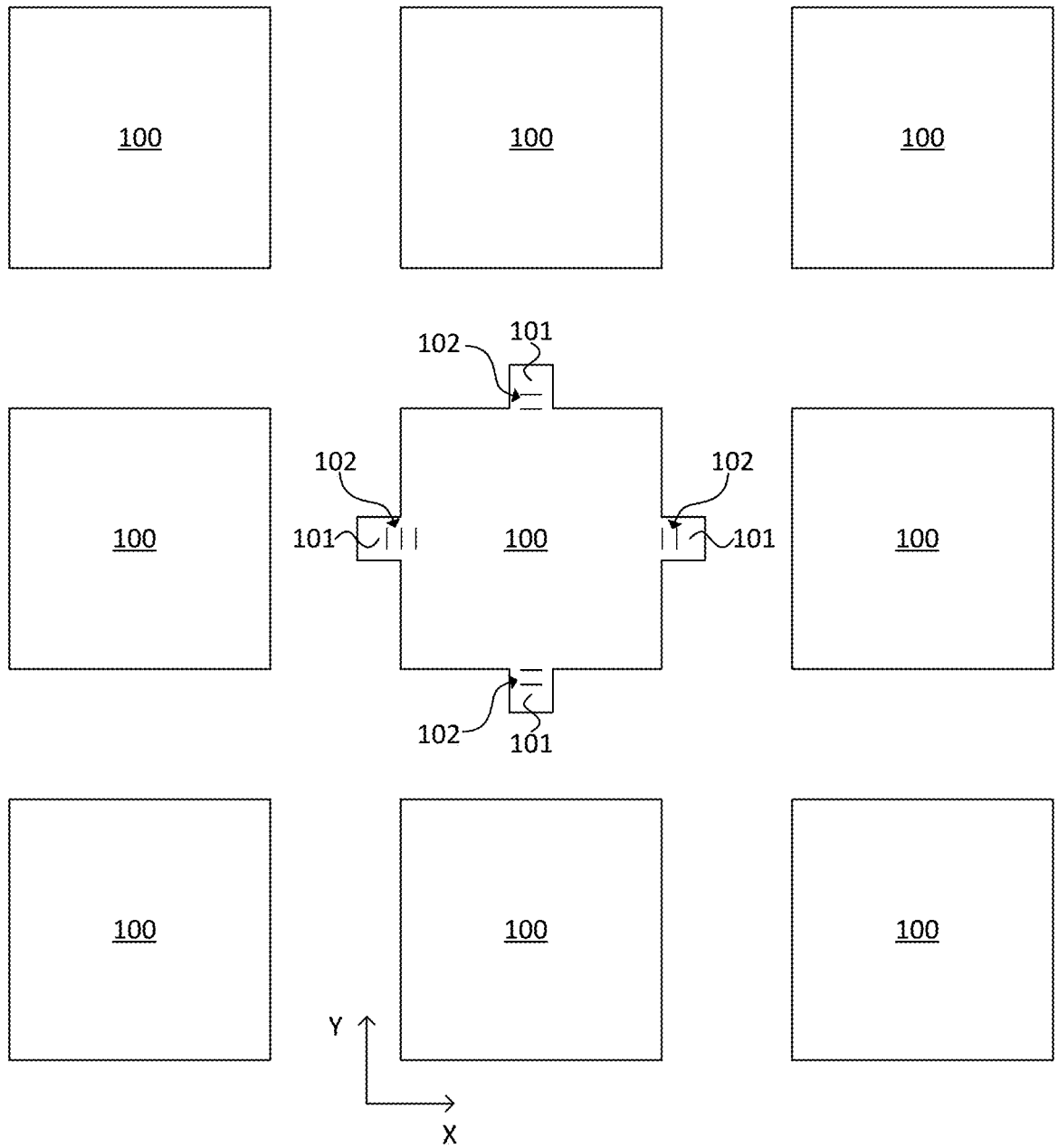
FIG. 2 is an embodiment of a device-attached overlay target design in a first layer.

FIG. 2 is an embodiment of a device-attached overlay target design in a first layer. The first layer includes device arrays in mats 100, which are at least partly made of photoresist. Each of the mats 100 has four sides, but polygonal mats with more sides are possible. The mat 100 also may be referred to as a block. A "mat" may be part of a memory device, such as a DRAM structure, but the embodiments disclosed herein can apply to other designs with similar shapes or device structures. At least one of the mats 100 in the first layer includes extensions 101. The extensions 101 are each at an edge of one of the four sides of the mat 100. The mat 100 and/or extensions 101 can be formed using SAQP.

Each of the extensions 101 includes a first layer metrology target 102. The first layer metrology targets 102 may include structures (e.g., lines or gratings) generally oriented in the X-direction or Y-direction, though other orientations are possible.

While four extensions 101 are illustrates in FIG. 2, only two may be used. One extension 101 with metrology target structures in the Y-direction and one extension 101 with metrology target structures in the X-direction may be used. A single extension 101 with metrology target structures in the X-direction and Y-direction also can be used.

Figure 3:
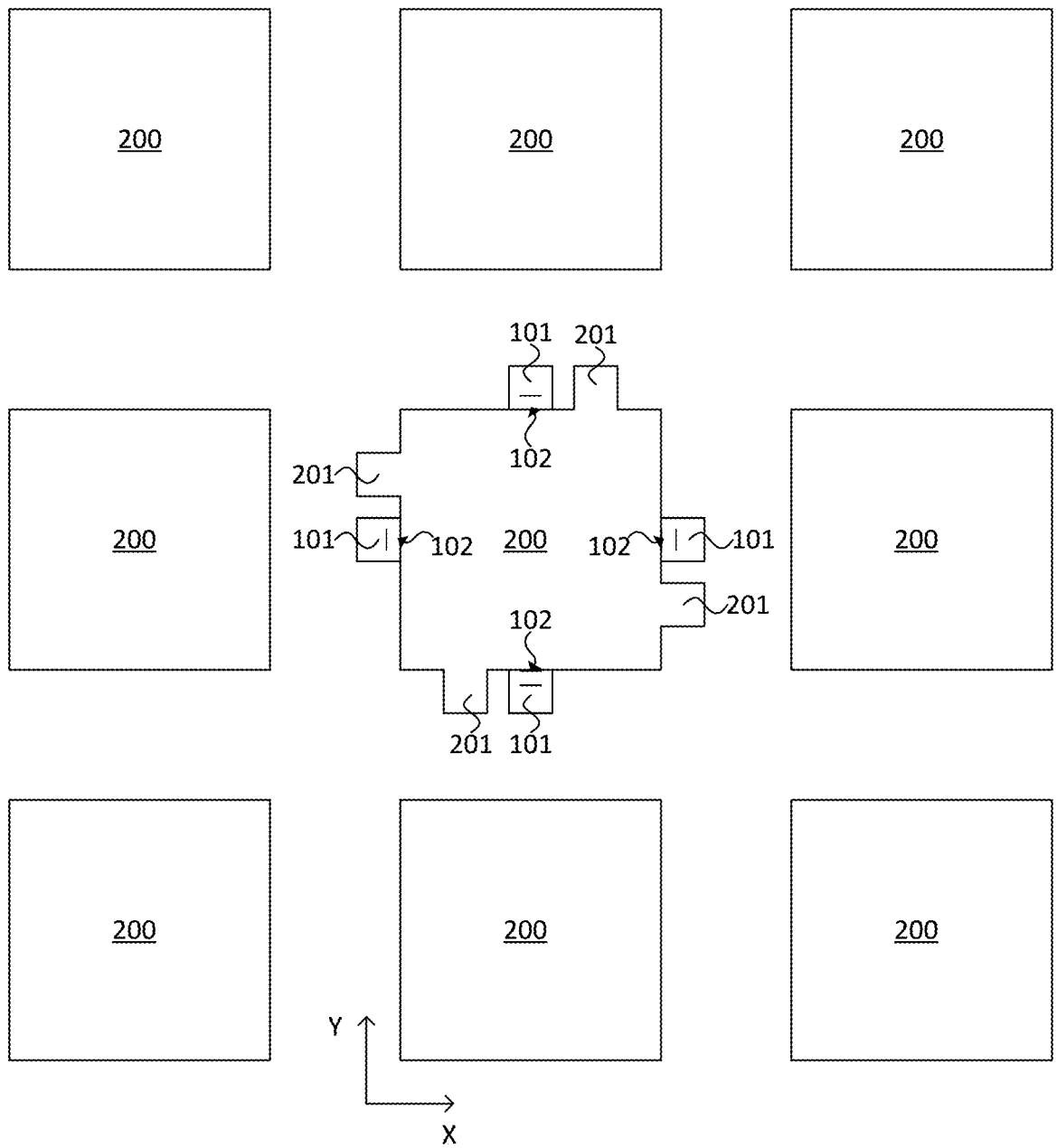
FIG. 3 is an embodiment of a device-attached overlay target design in a second layer.

FIG. 3 is an embodiment of a device-attached overlay target design in a second layer. The device array on the mats 200 includes a second layer. The second layer also is made at least partly of photoresist. The second layer is disposed on the first layer. The second layer can define a pattern of apertures. The apertures may be part of the device structure.

The mat 100 and/or first layer metrology target 102 can have a relaxed pitch that is less than a device pitch of the mat 200 or extension 201. The pitch of the mat 100 and/or first layer metrology target 102 may be relaxed because it is buried. The relaxed pitch can help with resolution through a device layer. For example, the first layer metrology targets 102 can have a relaxed pitch four times less than the device pitch (such as in FIG. 11) or eight times less than the device pitch (such as in FIG. 8).

The extensions 201 of the second layer are each at an edge of one of the four sides of the mat 200. The extensions 201 have the device pitch of the mat 200.

As shown in FIG. 3, the extensions 101 extend beyond the mat 200. The extensions 101 beyond the mat 200 are not covered by the mat 200 or the extensions 201. At least some of the first layer metrology targets 102 are covered by the mat 200. Less than an entirety of the first layer metrology targets 102 are covered by the mat 200.

Figure 4:
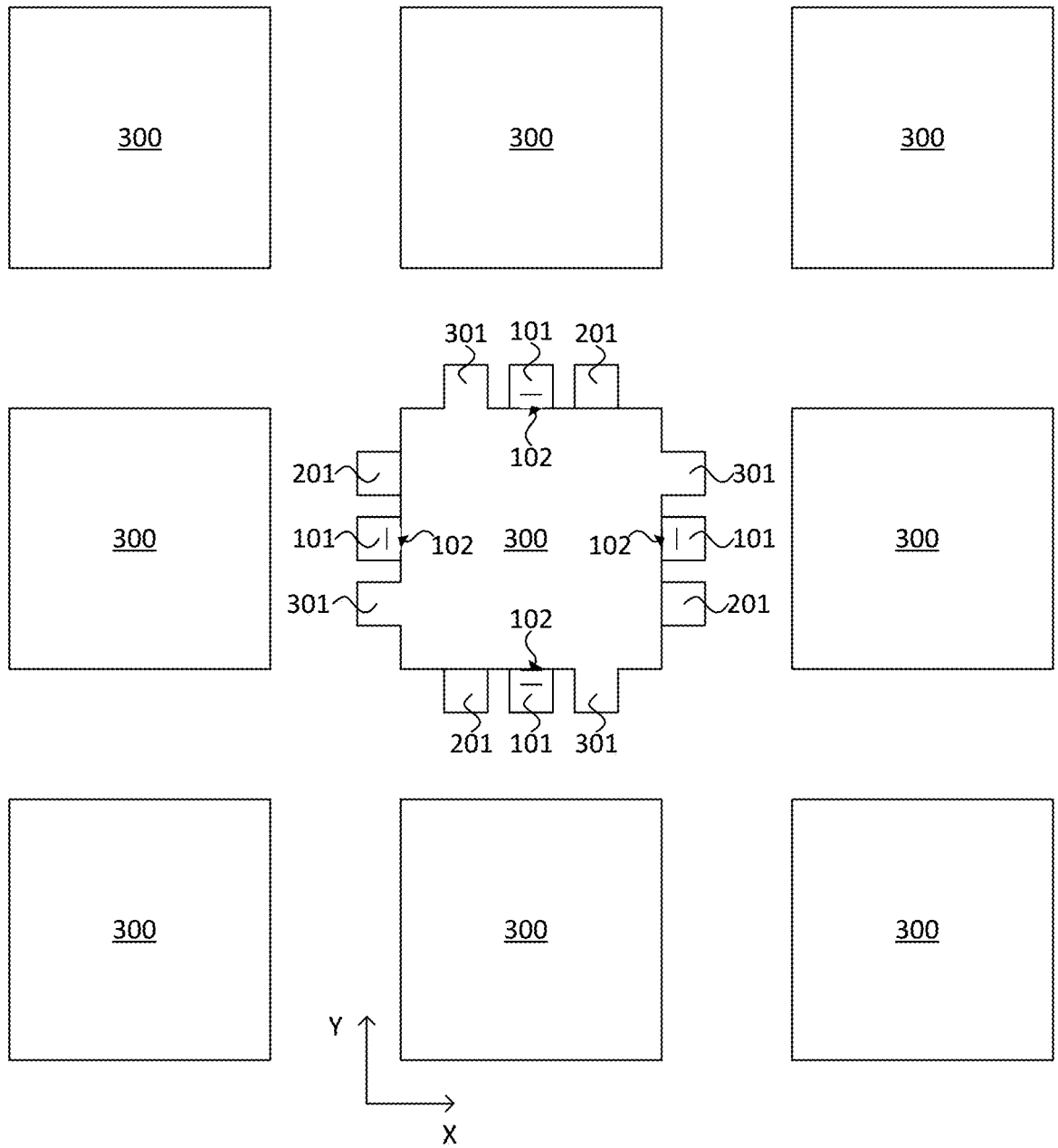
FIG. 4 is an embodiment of a device-attached overlay target design in a third layer.

FIG. 4 is an embodiment of a device-attached overlay target design in a third layer. The third layer also is at least partly made of photoresist. The third layer is disposed on the second layer. The third layer can define a pattern of apertures.

The extensions 301 of the third layer are each at an edge of one of the four sides of the mat 300. The extensions 301 have the device pitch of the mat 300.

As shown in FIG. 4, the extensions 201 extend beyond the mat 300. The extensions 201 beyond the mat 300 are not covered by the mat 300, the extensions 101, or the extensions 201. At least some of the first layer metrology targets 102 are covered by the mat 300. Less than an entirety of the first layer metrology targets 102 are covered by the mat 300.

While only three layers are shown, four layers, five layers, or more than five layers are possible. Each of the layers can include a mat and extensions similar to those described in the first, second, or third layers.

The extensions 201 and extensions 301 may include a metrology target with relaxed pitch compared to a layer that is formed later.

At least the second layer and third layer of the embodiments disclosed herein are real devices. Thus, the extensions are located proximate the real devices. Changes to the design of the devices may not be necessary.

The relaxed pitch for the extensions 101 can be at least four times a pattern pitch of the device in mat 200 or mat 300. For example, the relaxed pitch may be larger than 40 nm or larger than 100 nm.

The extensions 101, the extensions 201, and extensions 301 extend beyond the mat 300 into a region between device structures.

In an instance, the mat 100 is 60 μm or less in height and width. In another instance, the mat 100 is less than 50 μm in height and width. The mat 200 and mat 300 may be approximately the same size as the mat 100. The various metrology targets have dimensions smaller than the dimensions of the mat 100. A SEM scan field is typically less than 2 μm in dimensions.

Figure 5:
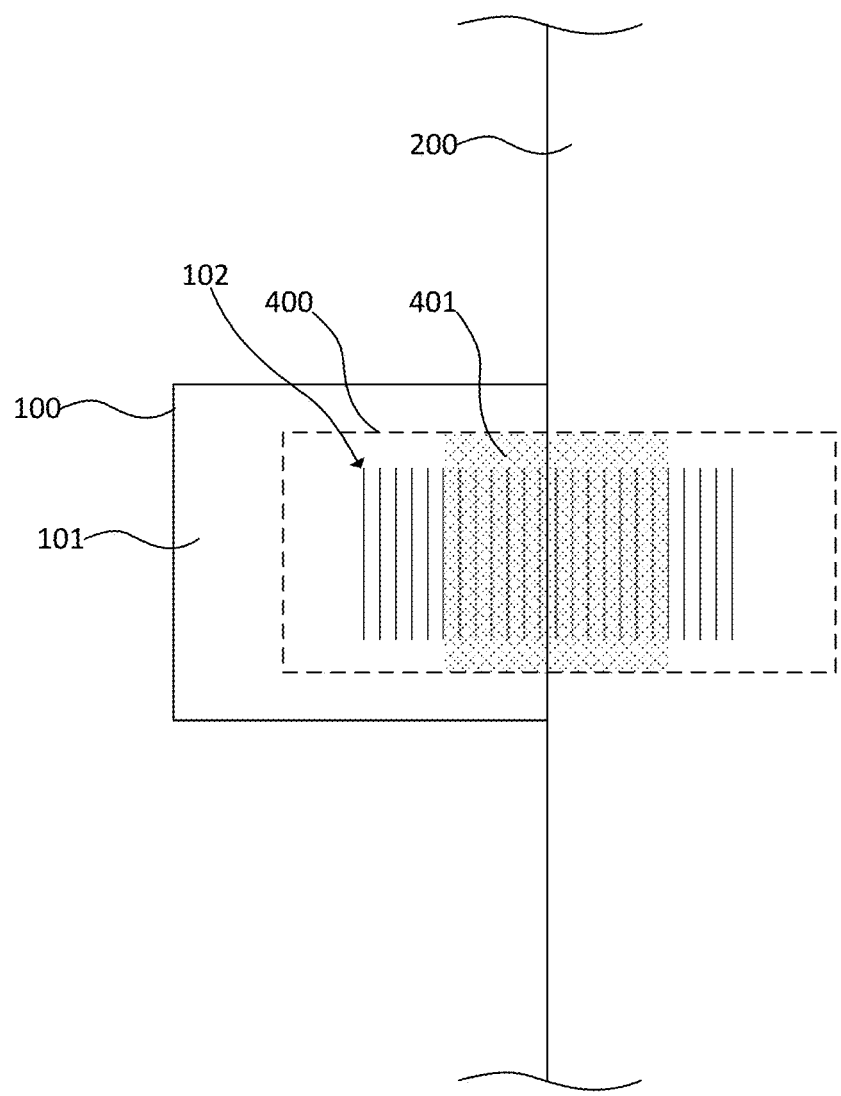
FIG. 5 shows the border region between the first layer and second layer.

FIG. 5 shows the border region between the first layer 100 and second layer 200. The mat 200 of the second layer is positioned over the first layer 100 with the first layer metrology target 102. The scan field 400 of the electron beam (shown with dashed line) can image both the extension 101 and the device array of the mat 200. However, the scan area can exclude the region 401 (shown with hatching), which is at the edge between the mat 200 and extension 101. Excluding the region 401 can avoid loading effects. For example, the scan field 400 can be 1 μm by 2 μm and the region 401 can be approximately 1 μm by approximately 1 μm.

As shown with FIG. 5, the first layer 100 and second layer 200 can be imaged simultaneously. The first layer metrology target 102 is imaged in the scan field 400. Some of the first layer metrology target 102 is under the second layer 200. Thus, the first layer metrology target 102 under the second layer 200 is imaged through apertures in the second layer 200. This is shown in FIG. 8.

When fabricating the structures of FIGS. 2-4, a photolithography process patterns the device area while cleaning out the photoresist in periphery area. As shown in FIG. 5, an electron beam can image both device area and periphery area simultaneously.

The device areas of the overlay targets in FIGS. 2-5 may be part of a DRAM device, static random-access memory (SRAM) device, magnetic random access memory (MRAM) device, or other memory devices. Logic devices or other integrated circuit devices also can benefit from the embodiments disclosed herein.

Figure 6:
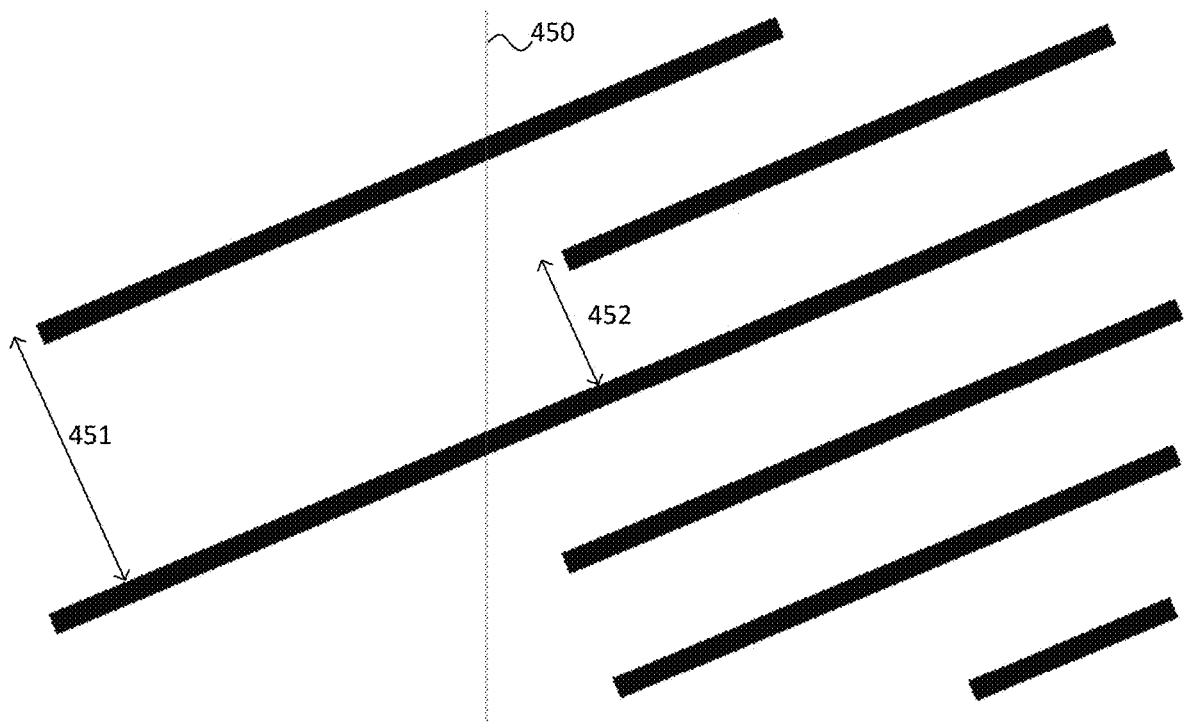
FIG. 6 illustrates exemplary pitch.
Figure 7:
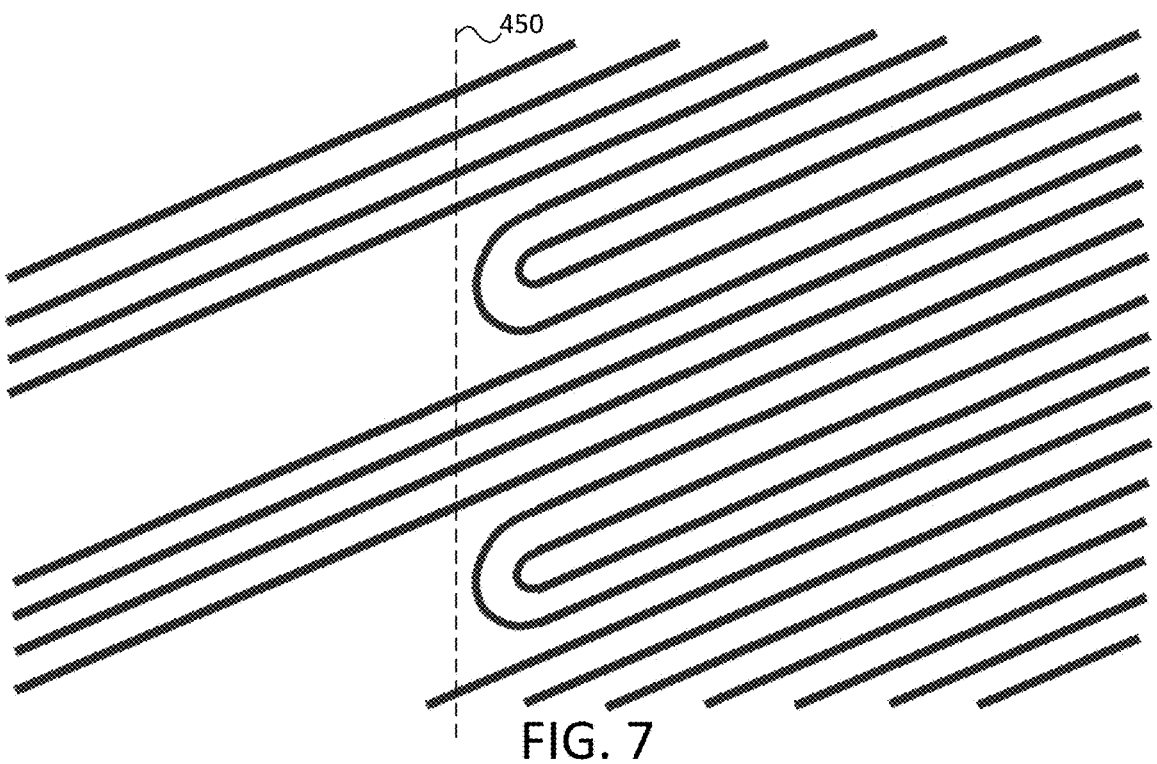
FIG. 7 illustrates the pitch of FIG. 6 after self-aligned quadruple patterning.
Figure 8:
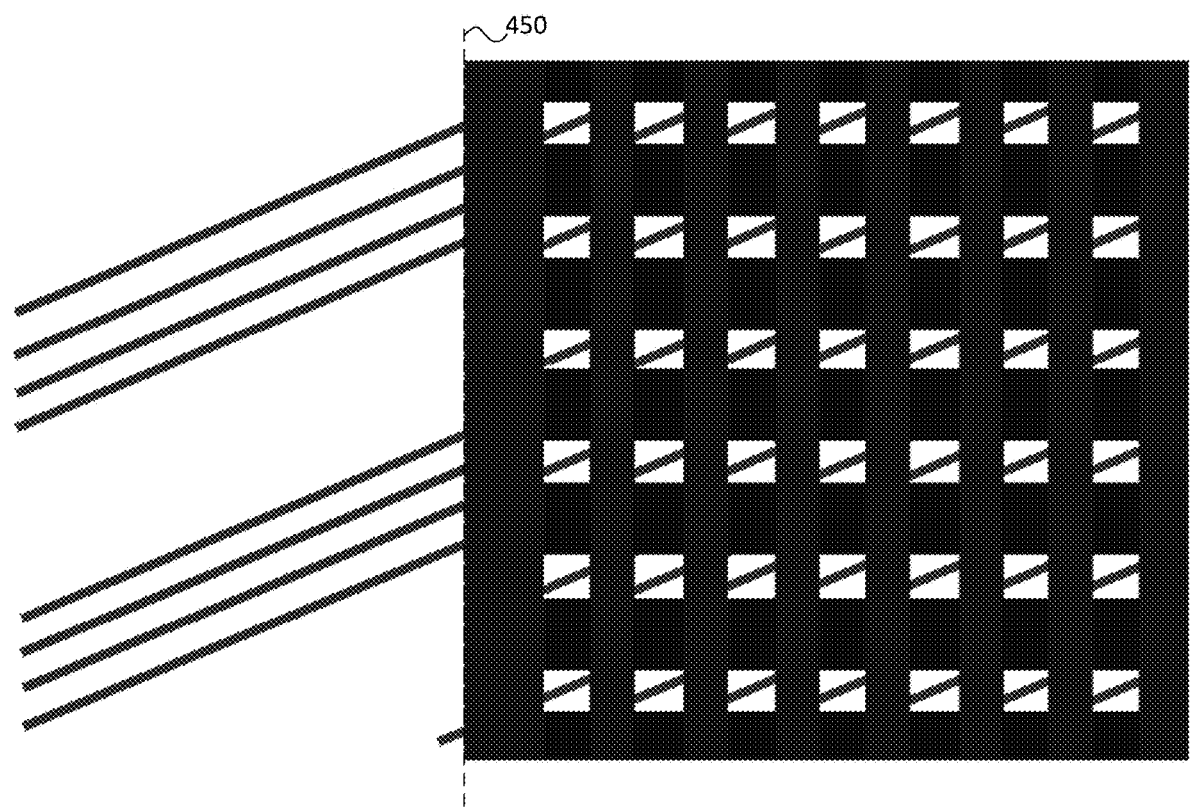
FIG. 8 illustrates the current layer pattern versus the buried previous layer pattern.

The design of FIGS. 6-8 are for a DRAM active area (AA) formation. FIG. 6 shows the layout of a dense cell area to the right of the lined 450 and a relaxed pitch 451 to the left of the line 450. The area to the right of the line 450 has a device pitch 452. The relaxed pitch 451 can be, for example, twice the device pitch 452. In an instance, device pitch 452 is an actual device structure and relaxed pitch 451 is a similar structure as device pitch 452 with a different pitch for overlay measurement.

FIG. 7 shows the previous layer pattern after SAQP. FIG. 8 illustrates the current layer pattern on the right and the buried previous pattern on the left, which has the relaxed pitch from FIG. 7. The photoresist with apertures to the right of 450 is the current layer pattern above the previous pattern seen through the apertures and to the left of 450. The apertures can allow an etch process to cut the previous pattern to form a final active area of a DRAM device. To perform overlay, the first layer metrology target is compared to device structure of the second layer. Thus, the relaxed pitch of the first layer metrology target is compared to the device pitch of the second layer, such as through the apertures in the second layer.

Figure 9:
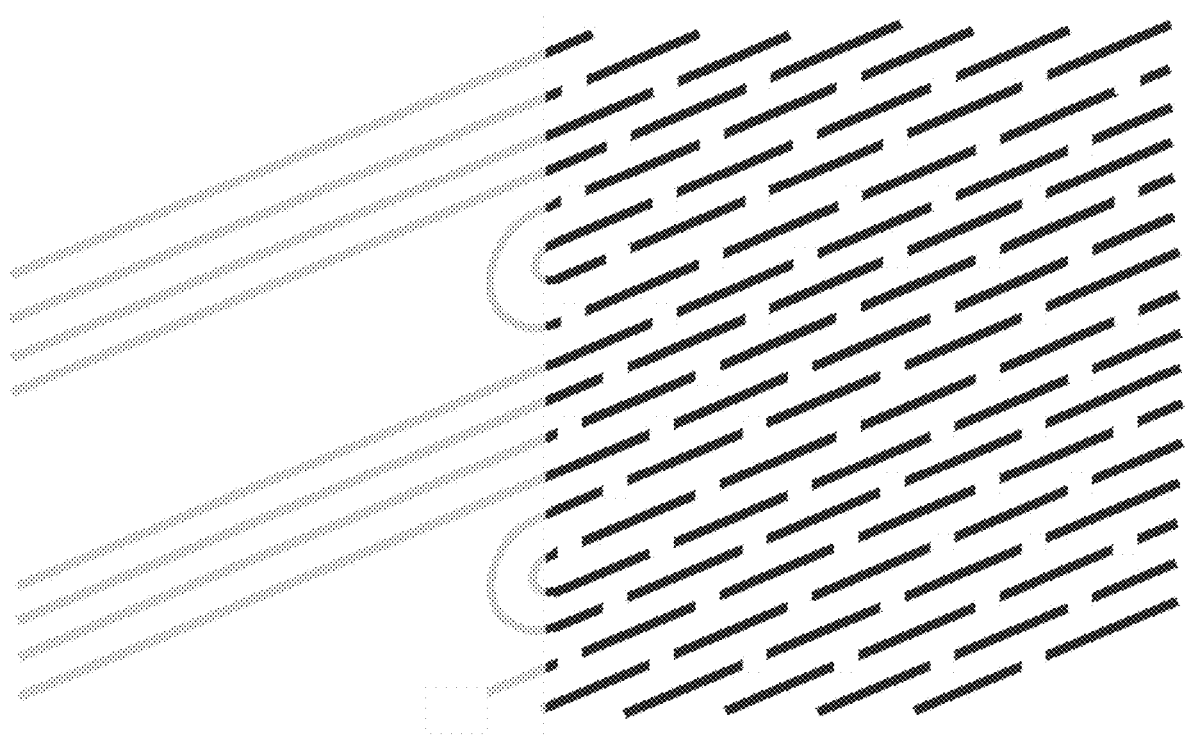
FIG. 9 illustrates the ACI of the current layer versus the buried previous layer pattern of FIG. 8.

A secondary electron (SE) image of an SEM can be used to obtain an image and measure the current layer (e.g., mat 200) with high-resolution and minimum interference from previous layer underneath the current layer. Simultaneously, a back-scattered electron (BSE) image of the SEM can be used to image the buried previous pattern (e.g., extension 101) with relaxed pitch. FIG. 9 illustrates the ACI of the current layer versus the buried previous layer pattern of FIG. 8.

Figure 10:
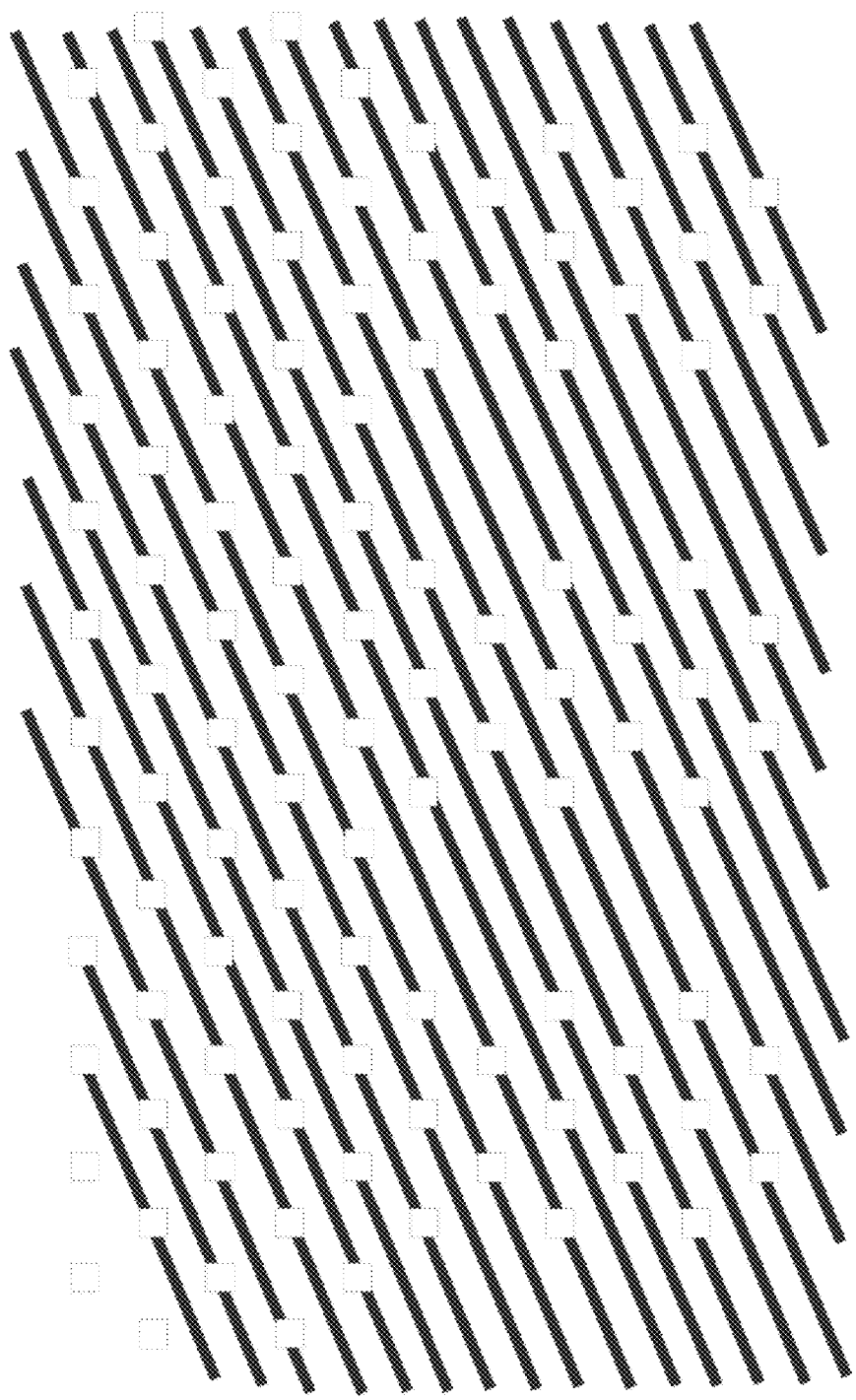
FIG. 10 illustrates another example of a second layer versus the previous layer pattern.
Figure 11:
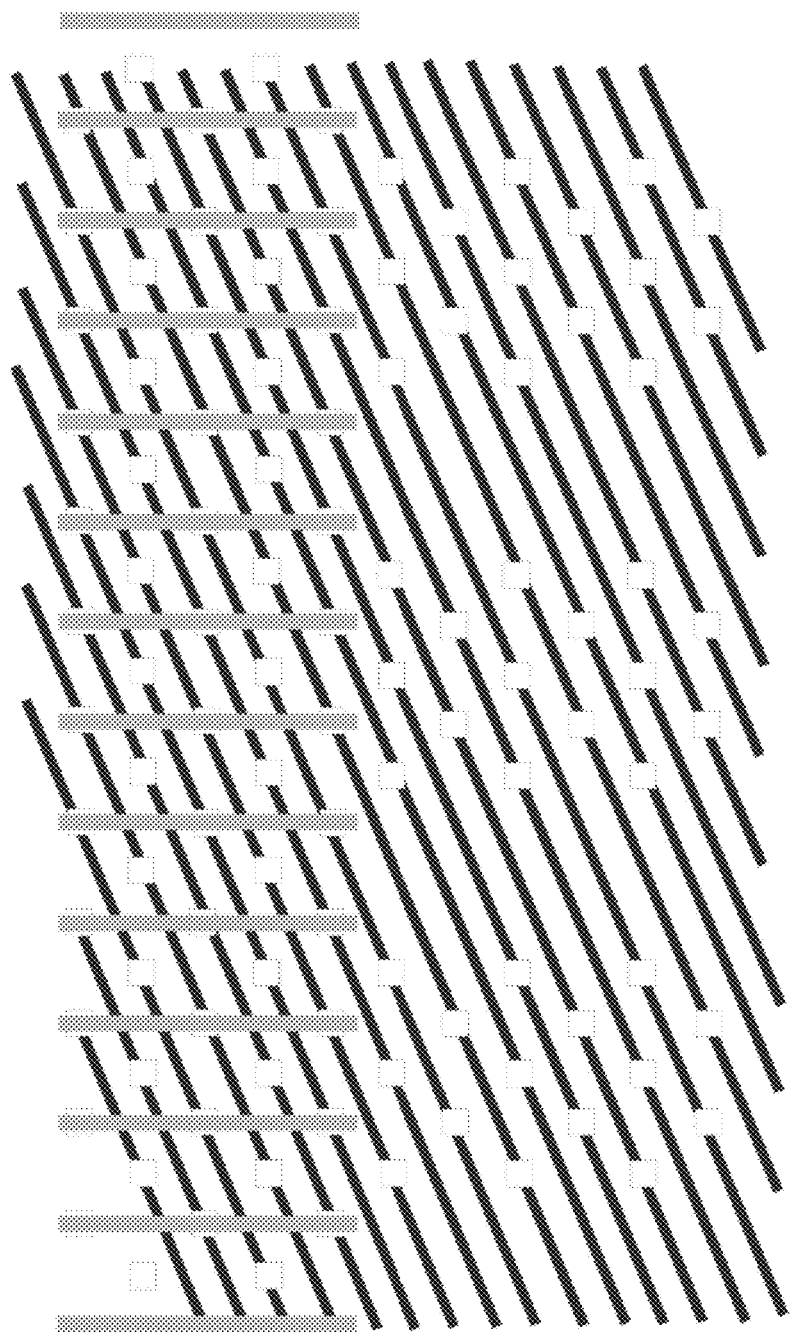
FIG. 11 illustrates a third layer versus the second layer and first layer of FIG. 10.

FIGS. 10 and 11 show an example with three layers. FIG. 10 illustrates another example of a second layer versus the previous layer pattern. The lines represent the pitch of the first layer. The boxes represent the areas imaged through apertures in the second layer. In an instance, FIG. 10 illustrates the lower box 201 of FIG. 3.

FIG. 11 illustrates a third layer versus the second layer and first layer of FIG. 10. The vertical rectangles represent the third layer. When comparing overlay of three layers, the device pitch of the third layer can be compared to the device pitch of the second layer. The relaxed pitch of the first layer can be compared to the device pitch of the second layer or the device pitch of the third layer.

Figure 12:
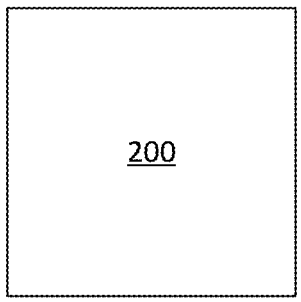
FIG. 12 is another embodiment of a device-attached overlay target design in a second layer.
Figure 12:
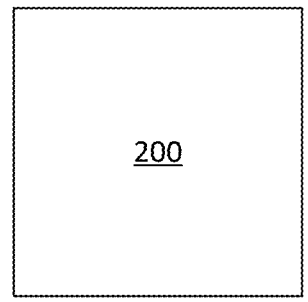
Figure 12:
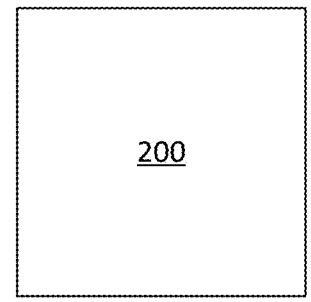
Figure 12:
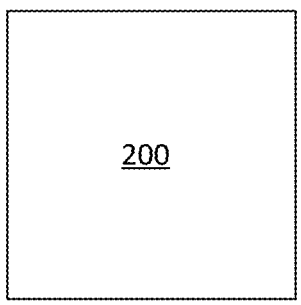
Figure 12:
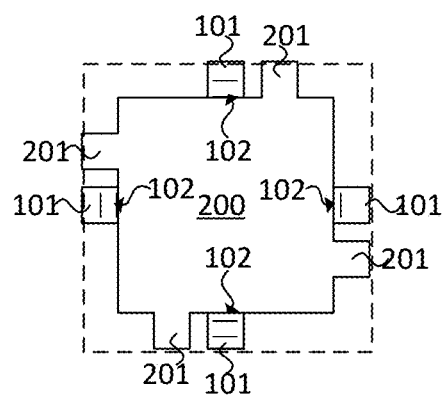
Figure 12:
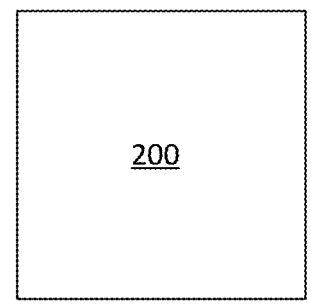
Figure 12:
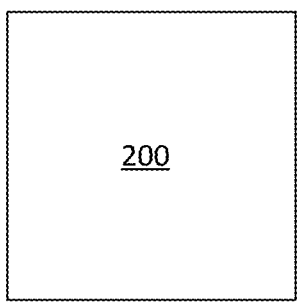
Figure 12:
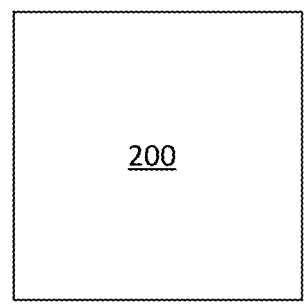
Figure 12:
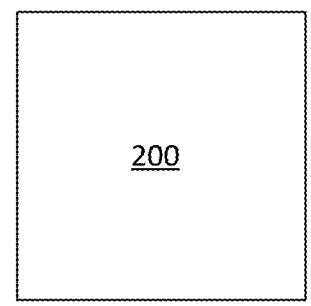

FIG. 12 is another embodiment of a device-attached overlay target design in a second layer. The relaxed pitch of the extension 101 and extension 201 are inside the original device area. Note that the dashed box, which represents the original device area. The original device area is the same size as the other mats shown in FIG. 12, though different device areas are possible. In the embodiment of FIG. 12, the extension 101 and extension 201 are extensions of the device area or are pullback from the current layer. The embodiment of FIG. 12 will reduce effects to the periphery circuits of neighboring mats.

Previously, optical targets were designed with patterns unlike real devices. These optical targets were placed in scribe line, far away from real devices. Unlike previous optical targets, the embodiments disclosed herein use the real device layout for photoresist patterns and the buried previous layer, which also is device-like with a relaxed pitch, as the real periphery devices. The buried previous layer can be placed close to real devices. The devices may have dense, repeating patterns and may be positioned proximate each other, which reduces error. Overlay and critical dimension uniformity (CDU) measurement on these targets can correlate to overlay value in real devices.

Thus, the embodiments disclosed herein can use the device layout of a whole mat in a device area to form multiple metrology targets to measure and control photolithography process in an ADI layer. This can be used to measure parameters such as overlay and CD. CD measures distance between two points, which may be in a single layer. Overlay measures alignment between structures in two layers, which can be determined by finding a center of gravity for each layer using an algorithm. These centers of gravity can be compared.

Using targets that are real device patterns or device-like patterns can make the measurement results device-relevant or device-correlated. A real device layer can be used for the current layer for electron beam-based overlay metrology. The device-like layout with relaxed pitch in the previous layer patterning can be positioned at one or more sides of the mat, such as on all four sides of the device array mat.

Semiconductor manufacturers can design the target into a device layout. Electron beam overlay systems can be used to image and measure the overlay during an ADI step.

Figure 13:
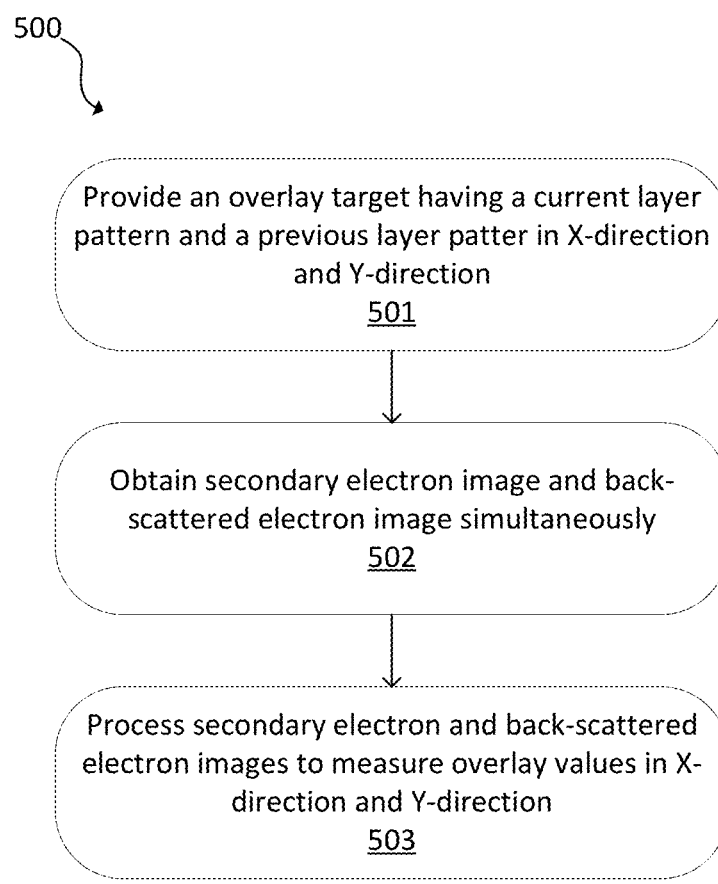
FIG. 13 is a flowchart of an embodiment of a method in accordance with the present disclosure.

FIG. 13 is a flowchart of an embodiment of a method 500. A device is provided at 501. The overlay target can be in an extension of a mat. The mat can be a device area having four sides, such as that shown in FIG. 3. The mat can include at least a first layer of photoresist and a second layer of photoresist disposed on the first layer. The overlay target also includes a plurality of first layer metrology targets, such as in an extension. Each of the first layer metrology targets is part of the first layer at an edge of one of the four sides of the mat. The first layer metrology targets have a relaxed pitch less than a device pitch in the mat. The second layer defines a pattern of apertures. The overlay targets have structures that extend generally in both the X-direction and Y-direction.

An image of the first layer overlay targets with an electron beam metrology tool is obtained at 502. Obtaining the image includes simultaneously obtaining an SE image of the second layer and obtaining a BSE image of the first layer with the relaxed pitch.

Metrology is performed with the image at 503. The metrology can be overlay or critical dimension. Overlay can be measured between, for example, the first layer and second layer, the second layer and the third layer, or the third layer and the first layer.

In an instance, the secondary electron image of the second layer is a non-zero distance from the back-scattered electron image of the first layer. The secondary image of the second layer is a non-zero distance from a closest of the sides of the mat. For example, FIG. 5 shows a rectangular scan field. The secondary electron image of the second layer is separated from the back-scattered electron image of the first layer by the excluded region.

The relaxed pitch may be unresolved by the electron beam metrology tool. The device pitch may be resolved by the electron beam metrology tool.

The overlay target can include a plurality of extensions of the second layer. Each of the extensions of the second layer is part of the second layer at an edge of one of the four sides of the mat. The extensions of the second layer extend beyond the sides of the mat.

The overlay target can include a third layer, like that illustrated in FIG. 4. The third layer is disposed on an opposite side of the second layer from the first layer. The third layer includes a plurality of extensions of the third layer. Each of the extensions of the third layer is part of the third layer at an edge of one of the four sides of the mat. The third layer defines a plurality of apertures. Performing metrology can include obtaining a secondary electron image of the third layer with the pattern of apertures and obtaining a back-scattered electron image of the first layer with the relaxed pitch, which can occur simultaneously.

The extensions of the second layer and the extensions of the third layer can optionally include metrology targets, which may have the relaxed pitch or a device pitch.

An electron beam metrology tool can be used to perform the method 500. The electron beam metrology tool can be in electronic communication with a processor that is configured to send instructions for the imaging and/or perform metrology on the resulting images. This can include using a personal computer system, image computer, mainframe computer system, workstation, network appliance, internet appliance, or other device.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A device comprising:
    a mat in a device area having four sides, wherein the mat includes at least a first layer of photoresist and a second layer of photoresist disposed on the first layer;
    a plurality of extensions in the first layer that extend beyond the sides of the mat, wherein each of the extensions in the first layer includes a first layer metrology target, and wherein the first layer metrology targets have a relaxed pitch less than a device pitch in the second layer of the mat; and
    wherein the second layer defines a pattern of apertures and the second layer covers at least part of each of the first layer metrology targets.

2. The device of claim 1, wherein the device area is part of a DRAM device.

3. The device of claim 1, wherein the relaxed pitch is larger than 40 nm.

4. The device of claim 1, further comprising a plurality of extensions of the second layer, wherein each of the extensions of the second layer is part of the second layer at an edge of one of the four sides of the mat.

5. The device of claim 4, wherein the extensions in the second layer extend beyond the sides of the mat.

6. The device of claim 1, wherein the mat is smaller than 60 μm in height and width, and wherein the extensions of the first layer are smaller than the mat.

7. The device of claim 1, further comprising a third layer disposed on an opposite side of the second layer from the first layer, wherein the third layer includes a plurality of extensions of the third layer, wherein each of the extensions of the third layer is at an edge of one of the four sides of the mat.

8. The device of claim 7, wherein the third layer defines a plurality of apertures.

9. The device of claim 1, wherein the relaxed pitch is four times less than the device pitch.

10. The device of claim 9, wherein the relaxed pitch is eight times less than the device pitch.

11. A method comprising:
    providing a device that includes:
        a mat in a device area having four sides, wherein the mat includes at least a first layer of photoresist and a second layer of photoresist disposed on the first layer;
        a plurality of extensions in the first layer that extend beyond the sides of the mat, wherein each of the extensions in the first layer includes a first layer metrology target, and wherein the first layer metrology targets have a relaxed pitch less than a device pitch in the second layer of the mat; and
        wherein the second layer defines a pattern of apertures and the second layer covers at least part of each of the first layer metrology targets;
    obtaining an image of at least one of the first layer overlay targets with an electron beam metrology tool, wherein the obtaining includes simultaneously obtaining a secondary electron image of the second layer and obtaining a back-scattered electron image of the first layer with the relaxed pitch; and
    performing, using a processor, metrology with the image.

12. The method of claim 11, wherein the metrology is overlay or critical dimension.

13. The method of claim 11, wherein the secondary electron image of the second layer is a non-zero distance from the back-scattered electron image of the first layer, and wherein the secondary image of the second layer is a non-zero distance from a closest of the sides.

14. The method of claim 11, wherein the relaxed pitch is unresolved by the electron beam metrology tool and the device pitch is resolved by the electron beam metrology tool.

15. The method of claim 11, wherein the device area is part of a DRAM device.

16. The method of claim 11, wherein the relaxed pitch is larger than 40 nm.

17. The method of claim 11, wherein the device further comprises a plurality of extensions of the second layer, wherein each of the extensions of the second layer is part of the second layer at an edge of one of the four sides of the mat, wherein the extensions of the second layer extend beyond the sides of the mat.

18. The method of claim 17, wherein the device further comprises a third layer disposed on an opposite side of the second layer from the first layer, wherein the third layer includes a plurality of extensions of the third layer, wherein each of the extensions of the third layer is part of the third layer at an edge of one of the four sides of the mat, and wherein the third layer defines a plurality of apertures, and wherein the method further comprises:
    obtaining a secondary electron image of the third layer with the pattern of apertures; and
    obtaining a back-scattered electron image of the first layer.

19. The method of claim 11, wherein the mat is smaller than 60 $\mu$m in height and width, and wherein the extensions of the first layer are smaller than the mat.

* * * * *